United States Patent
Söderbärg et al.

[11] Patent Number: 5,844,272
[45] Date of Patent: Dec. 1, 1998

[54] SEMICONDUCTOR COMPONENT FOR HIGH VOLTAGE

[75] Inventors: Anders Söderbärg, Upsala; Per Svedberg, Spånga, both of Sweden

[73] Assignee: Telefonaktiebolaet LM Ericsson, Stockholm, Sweden

[21] Appl. No.: 900,829

[22] Filed: Jul. 25, 1997

[30] Foreign Application Priority Data

Jul. 26, 1996 [SE] Sweden ................................ 9602881

[51] Int. Cl.$^6$ .......................... H01L 29/76; H01L 29/94; H01L 31/062; H01L 31/113
[52] U.S. Cl. .......................... 257/328; 257/336; 257/339; 257/343; 257/344; 257/352; 257/364
[58] Field of Search .................... 257/328, 336, 257/339, 343, 344, 352, 364

[56] References Cited

U.S. PATENT DOCUMENTS

| | | | |
|---|---|---|---|
| 5,418,383 | 5/1995 | Takagi et al. | 257/48 |
| 5,517,046 | 5/1996 | Hsing et al. | 257/336 |
| 5,561,313 | 10/1996 | Saitoh et al. | 257/360 |

OTHER PUBLICATIONS

Svedberg, P., Swedish Patent Application No. 8903761, "Mutual Channel Transistor", 1992.

Tiensuu, S. et al. "MUCH Transistor—A MOS Like Switch For Smart Power", Proc. 24th European Solid State Device Res. Conf. (ESSDERC 94), p. 225, 1994.

Söderbärg, A. et al., "Integration of a Novel High–voltage Giga–Hertz DMOS Transistor into Standard CMOS Process", Proc. IEEE–IEDM–95, pp. 975–978, 1995.

Mena, J.G. et al., "High–voltage Multiple Resistivity Drift Region LDMOS", Solid State Electronics, vol. 29, No. 6, pp. 647–656, 1986.

Appels, J.A. et al., "Thin Layer High Voltage Devices", Philip J. Rex., vol. 35, pp. 1–13, 1980.

Disney, D.R., "Physics and Technology of Lateral Power Devices in Silicon–On–Insulator Substrates", No. ICL 93–020, Integrated Circuits Laboratory, Stanford University, Jun. 1993.

*Primary Examiner*—Ngân V. Ngô
*Attorney, Agent, or Firm*—Burns, Doane, Swecker & Mathis, L.L.P.

[57] ABSTRACT

A high frequency MOS transistor structure with an extended drift region, which modulates the resistance in the drift region of the MOS transistor. The extended gate layer is obtained by an extra semiconductor layer forming a second MOS structure on top of a thin gate oxide layer. The electrical field will then be uniformly distributed laterally in the extended drift region. This design makes it possible to produce a MOS transistor with a short channel length and an extended drift region with low doping concentration and still having very low on-resistance together with a high breakdown voltage.

18 Claims, 3 Drawing Sheets

5,844,272

SEMICONDUCTOR COMPONENT FOR HIGH VOLTAGE

TECHNICAL FIELD

The present invention refers to an improvement of a MOS transistor and more exactly a MOS transistor with an extended drift region having modulation of the resistance in the drift region.

BACKGROUND

It is earlier known that field effect transistors of MOS-type effectively can be used as a switching component. Such transistors should have a low on-resistance and a low off-capacitance. However, the low breakdown voltage between the gate oxide and the channel region in a traditional MOS transistor limits the maximum possible working voltage for such a transistor design.

By introducing an extended drift region outside the channel and gate oxide area, the vertical field over the gate oxide can be reduced. Thereby the voltage breakdown for the component can be increased. However, to avoid avalanche breakdown in the extended drift region, that region has to have a low doping concentration, which increases the total on-resistance of the component.

Different techniques to improve a lateral solution have been presented. One such technique is commonly referred to as RESURF, which stands for REduced SURface Field. In FIG. 1 is demonstrated a DMOS structure with an extended drift region, designed with the RESURF techniques. The idea is to mainly deplete the n doped drift region from below and much less from the pn junction between the body and drift region. More information on this technique is found in J. A. Appels et al., "Thin layer high voltage devices", Philips J. Res., Vol 35, pp 1–13, 1980. According to Appels et al. it is possible to make high voltage transistors for collector-emitter voltages up to 1000 volts with a technique which allows the use of relatively thin epitaxial layers of 3–15 μm.

Additional background on this subject may be found for example in papers by J. G. Mena and C. A. T. Salama, "High-Voltage multiple resistivity drift region LDMOS", Solid State Electronics, Vol. 29, No. 6, pp 647–656, 1986; and A. Söderbärg et al., "Integration of a Novel High-Voltage Giga-Hertz DMOS Transistor into a Standard CMOS Process", Proc. IEEE-IEDM-95, pp 975–978, 1995. According to this a higher doping level in the extended drift region can be used without introducing avalanche breakdown. But these and similar solutions still have an unacceptable high on-resistance for several switching applications.

In a Swedish Patent No. 89037618 "Mutual channel transistor", to P. Svedberg, 1992, as well as a document by S. Tiensuu et al., "MUCH Transistor—A MOS Like Switch For Smart Power", Proc. 24th European Solid State Device Res. Conf. (ESSDERC 94), p 225, 1994, a device with a long channel is described. The gate material in that device is replaced by a second silicon layer with a complementary channel region as shown in FIG. 2 which demonstrates a cross section of a mutual channel transistor. The structure according to FIG. 2 is as follows: Onto an insulated substrate 1 a first field effect transistor is created having a $n^+$ doped source 2, a p doped channel 3 and a $n^+$ doped drain 4. On top of the first NMOS FET an insulating silicon oxide layer 5 is applied. Additionally on this layer 5 is created a second field effect transistor having a $p^+$ doped source 11, a n doped channel 12 and a $p^+$ doped drain 13. Thus the second field effect transistor constitutes a PMOS FET. As is seen in FIG. 2 the channel of the lower NMOS transistor is slightly longer than the length of the upper PMOS transistor. The width of the channels is in a suitable way adapted to the desired current handling ability of the device. The two low doped regions in the upper and lower structure layers deplete each other if there is a balance between the dopants. The channel pair has to be long enough to handle the electrical field between source and drain in off state.

By mutual cross-talk between the two channel regions the device can work both as a conventional MOS device in on state and effectively distribute the high voltage in off state, without using any extended drift region. The on-resistance of the device is then no longer increased by a low doped drift region. Furthermore the field between source and drain can be very well distributed if a correct doping balance between the two channel regions is used. To summarize, by using this mutual channel transistor techniques a component with very low on-resistance and high breakdown voltage can be designed on a smaller chip area. The disadvantage of such a component design is that it can not be realized with a short channel, which limits the high frequency properties. Further, two separate gate controllers are needed for the component, one for the low voltage side and one for the high voltage side, which makes the switching control more complex.

Another common technique to reduce the on-resistance is to modulate the drift regions with minority carriers, as in different IGBT (Insulated Gate Bipolar Transistor) solutions, also see D. R. Disney, "Physics and Technology of lateral power devices in Silicon-On-Insulator Substrates", No. ICL 93-020, Integrated Circuits Laboratory, Stanford University, June 1993. However, this modulation technique both induces a non-linear on-resistance and has poor frequency properties.

To conclude, there is still a call for improvements of the MOS transistor designs when the transistor is to be utilized for high frequency applications considering high voltage and low on-resistance.

SUMMARY

The present invention provides a lateral MOS transistor, particularly for high frequency use, in which the gate current is controlled and a normal control voltage for the channel may be used due to the utilization of an extended drift region, which modulates the resistance in the drift region by the extra semiconductor layer or extended gate on top of the drift region. That makes it possible to design a MOS transistor with a short channel length and an extended drift region with low doping concentration but still obtain very low on-resistance together with high breakdown voltage. The transistor according to the invention may either be a DMOS device of n type or p type.

The scope of the invention is set forth by the independent claims 1 and 10, while different embodiments of the present invention are set forth by the dependent claims 2–9 and 11–19.

BRIEF DESCRIPTION OF THE DRAWINGS

The invention, together with further objects and advantages thereof, may best be understood by making reference to the following description taken together with the accompanying drawings, in which.

DETAILED DESCRIPTION

Figure 1:
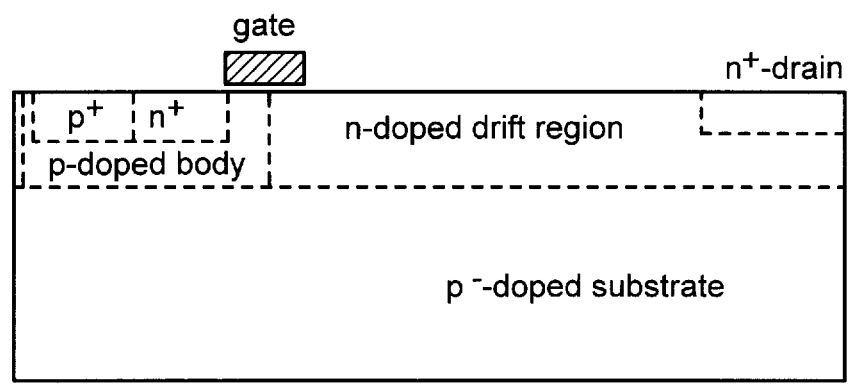
FIG. 1 demonstrates a cross section of a prior art DMOS with an extended drift region, designed with the RESURF techniques.
Figure 2:
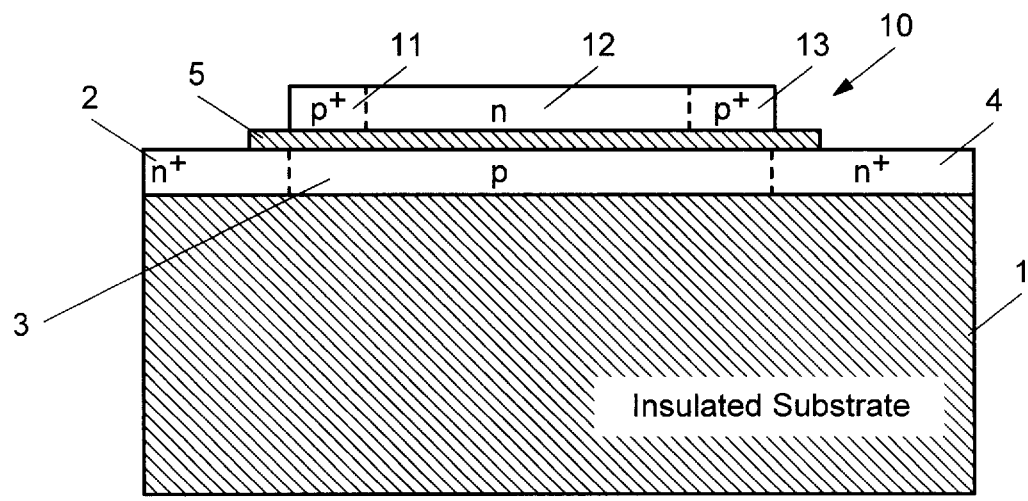
FIG. 2 shows a cross section of a prior art mutual channel transistor.
Figure 3:
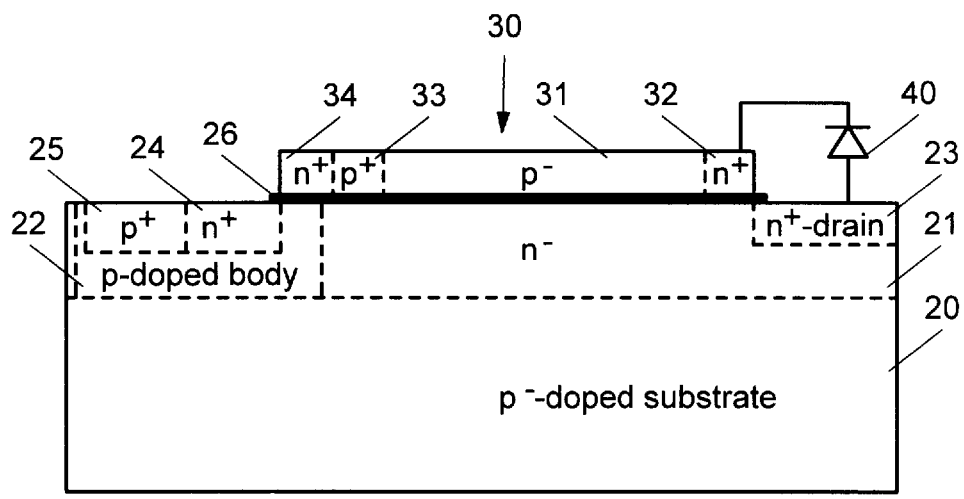
FIG. 3 shows a cross section of a transistor design in bulk silicon according to a first embodiment of the present invention.

FIG. 3 shows a cross section of an embodiment of the present invention. Onto a p$^-$ doped substrate 20 a n$^-$ doped layer 21 acting as a channel is created. In the layer 21 a p doped body 22 and a n$^+$ doped drain 23 are created. In the p doped body is then created a n$^+$ doped source 24 as well as an additional p$^+$ doped area 25. The areas 24 and 25 of the source area as well as the area 23 of the drain is in a standard way provided with contacts (not shown) for connection of the device into an electronic circuitry. At the upper portion of the layer 21 acting as channel a thin insulator layer 26, e.g. silicon oxide, is added, which will act as a gate isolator. On top this created structure constituting a drift region another layer of silicon or poly-silicon is arranged which forms the extended gate layer 30. The extended gate layer has a similar structure but with the opposite doping as the described drift region and contains a p$^-$ channel 31, a n$^+$ drain 32 and a p$^+$ source 33 with an additional n$^+$ doped area 34. The areas 31, 32, 33, 34 and 25 will additionally in a normal way be provided with the necessary contacts (not shown) for the connection of the device into an electronic circuitry.

The channel and gate region can be designed and fabricated using standard CMOS techniques. The drift region may be modulated by the silicon or polysilicon layer of the opposite doping type. The same layer as the gate material may well be used. To laterally distribute the high voltage uniformly, the high voltage side of the top layer has to be connected to the drain. To avoid a high gate leakage current in the top layer when the transistor in on (when the gate voltage is higher than the drain voltage) the connection between the top layer and the drain contact can be achieved by integration of a diode 40 as shown in FIG. 3.

In an on state the gate voltage is high compared to the voltage on source and the drain. The channel resistance is modulated in the same way as in an ordinary MOS device. Because of the higher potential of the layer above the extended drift region majority carriers will be accumulated near the silicon surface. This accumulation of majority carriers drastically reduces the resistance in the drift region. Due to that the resistance modulation is of majority carrier type, there will not be any high frequency or non-linearity problems, as will be the case for IGBT. The gate leakage current is reduced by the reversed biased diode on the drain side.

Figure 5:
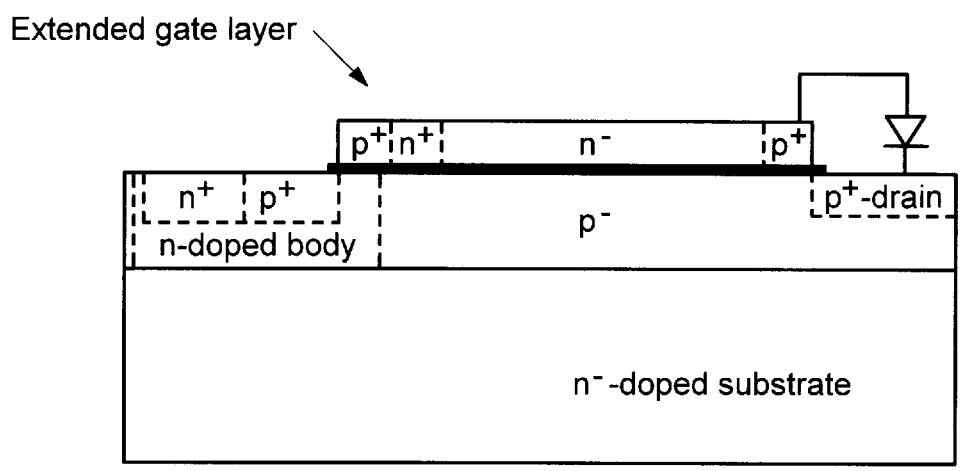
FIG. 5 shows a cross section of a transistor design in bulk silicon according to a third embodiment of the present invention.

In an off state the channel region is off in the same way as it is for an ordinary MOS device. The potential in the layer above the extended drift region will always be equal or less than the potential in the silicon below. Thereby, the extended drift region can be vertically depleted in a similar way as in the well known RESURF techniques (see J. A. Appels et al.). The electrical field will then be uniformly distributed laterally in the extended drift region. Leakage current in the top layer is reduced by the fact that this silicon also will be depleted from the drift region below. The illustrated embodiment discloses a DMOS device of n type, but a corresponding DMOS device of p type will correspondingly be feasible by changing the doping polarities, which is illustrated in FIG. 5. In the demonstrated embodiments passivating layers like oxide and nitride layers well known to a person skilled in the art have not been included to in some extent simplify the drawings serving to explain the present invention.

Figure 4:
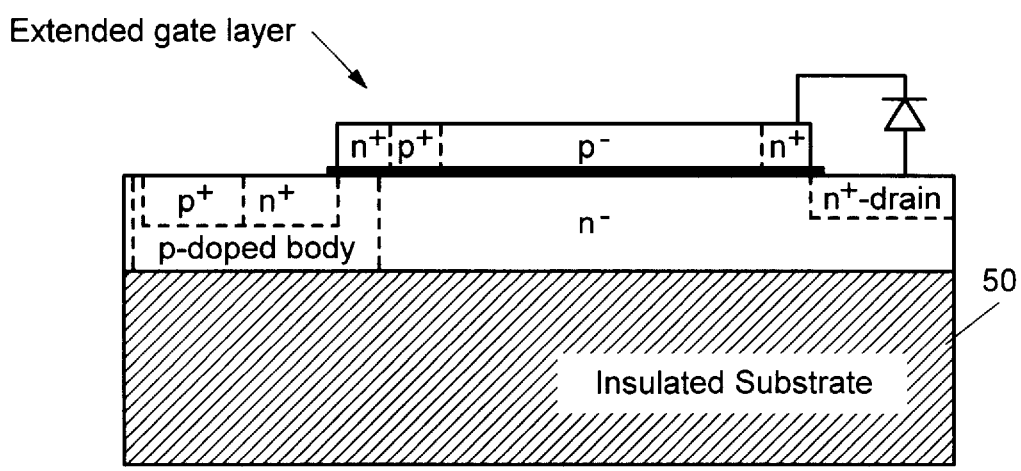
FIG. 4 shows a cross section of a transistor design and applying SOI techniques according to a second embodiment the present invention.
Figure 6:
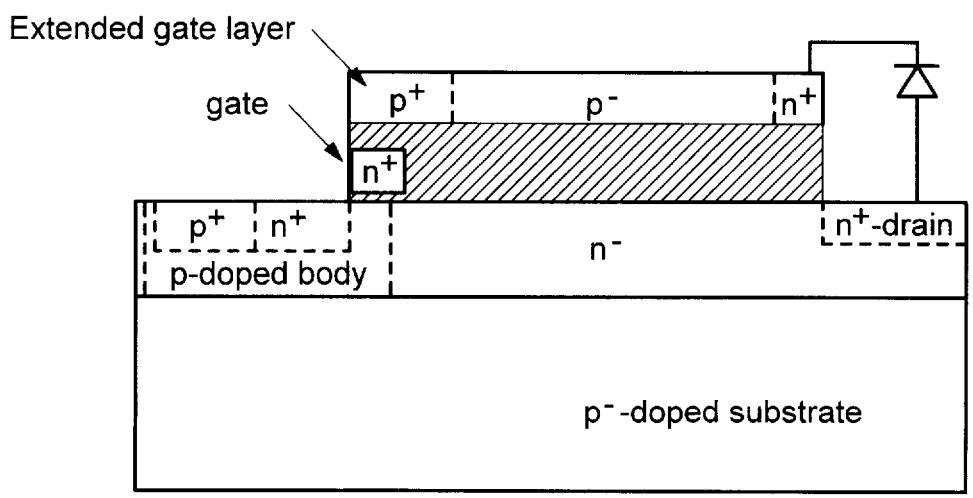
FIG. 6 shows a cross section of a transistor design according to a fourth embodiment of the present invention.

Such a device according to the present invention may be realized both in bulk and SOI materials, as indicated by FIGS. 3 and 4 for a n type DMOS device. Similarly the p type DMOS illustrated in FIG. 5 may be given a corresponding shape corresponding to the n type SOI DMOS of FIG. 4. In this case the channel resistance is modulated in the same way as in an ordinary PMOS device, i.e. by minority carriers. In another embodiment a combination of the bulk type and the SOI type of device may be produced by applying an insulating layer, e.g., a silicon dioxide between the bulk 20 and the n$^-$ doped layer 21 in FIG. 3 and correspondingly for the p type DMOS in FIG. 5. Still another embodiment of the present invention similar to FIG. 3 is demonstrated in FIG. 6. The structure of the gate is different in that the n$^+$ portion of the gate is separated from the extended gate layer and at the same time the insulation underneath the extended gate layer is made thicker compared to the structure of FIG. 3.

For the production of the device according to the present invention a standard MOS or DMOS process flow can be used, where the second semiconductor layer above the drift region can be integrated with the gate polysilicon layer or with a second polysilicon layer. That layer can also be added by wafer bonding or deposition of another semiconductor material. The channel region, e.g. region 22, may be defined by dopants added to the substrate before the gate material is deposited or it may also be defined by a lateral diffusion of the dopants from the edge of the gate layer.

It will be understood by those skilled in the art that various modifications and changes may be made to the device according to the concept of the present invention without departure from the spirit and scope thereof, which is defined by the appended claims.

What is claimed is:

1. A device forming a high voltage MOS transistor structure comprising a substrate with a n$^-$ doped semiconductor layer having a first n$^+$ doped drain area and a p doped body containing a second n$^+$ doped region and a first p$^+$ doped region forming a source area, said n$^-$ doped layer providing a drift channel between said drain and source areas, wherein on top of said drift channel an insulating gate oxide layer is disposed having on top a semiconductor layer which together with the insulating gate oxide layer forms an extended gate layer, whereby a diode is connected between said drain area and a third n$^+$ doped region in said extended gate layer.

2. The device according to claim 1, wherein said extended gate layer further comprises a p$^-$ doped region, a second p$^+$ doped region and a fourth n$^+$ doped region forming a MOS structure on top of said insulating gate oxide.

3. The device according to claim 1, wherein said substrate is a p$^-$ doped semiconductor.

4. The device according to claim 1, wherein said substrate is an insulator formed by sapphire or the like.

5. The device according to claim 1, wherein a silicon dioxide layer, forming a buried SOI layer, separates said n$^-$ doped semiconductor layer from an underlying substrate.

6. The device according to claim 1, wherein said diode is a suitable external semiconductor diode connected between said first n⁺ doped region in said n⁻ doped semiconductor layer and said third n⁺ doped region of said extended gate layer.

7. The device according to claim 1, wherein said diode is a semiconductor diode integrated between said first n⁺ doped region in said n⁻ doped semiconductor layer and said extended gate layer whereby said third n⁺ doped region may be part of the integrated diode.

8. The device according to claim 1, wherein said second n⁺ doped region and said first p⁺ doped region forming the source area are provided with separate contact pads.

9. The device according to claim 1, wherein said second p⁺ doped region and said fourth n⁺ doped region forming a source area of said extended gate layer are provided with separate contact pads.

10. A device forming a high voltage MOS transistor structure comprising a substrate with a p⁻ doped semiconductor layer having a first p⁺ doped drain area and a n doped body containing a second p⁺ doped region and first n⁺ doped region forming a source area, said p⁻ doped layer providing a drift channel between said drain and source areas, wherein on top of said drift channel an insulating gate oxide layer is disposed having on top a semiconductor layer which together with the insulating gate oxide layer forms an extended gate layer, whereby a diode is connected between said drain area a third p⁺ doped region in said extended gate layer.

11. The device according to claim 10, wherein said extended gate layer further comprises a n⁻ doped region, a second n⁺ doped region and a fourth p⁺ doped region forming a MOS structure on top of said insulating gate oxide.

12. The device according to claim 10, wherein said substrate is a n⁻ doped semiconductor.

13. The device according to claim 10, wherein said substrate is an insulator formed by sapphire or the like.

14. The device according to claim 10, wherein a silicon dioxide layer, forming a buried SOI layer, separates said p⁻ doped semiconductor layer from an underlying substrate.

15. The device according to claim 10, wherein said diode is a suitable external semiconductor diode connected between said first p⁺ doped region in said p⁻ doped semiconductor layer and said third p⁺doped region of said extended gate layer.

16. The device according to claim 10, wherein said diode is a semiconductor diode integrated between said first p⁺ doped region in said p⁻ doped semiconductor layer and said extended gate layer whereby said third p⁺ doped region may be part of the integrated diode.

17. The device according to claim 10, wherein said second p⁺ doped region and said first n⁺ doped region forming the source area are provided with separate contact pads.

18. The device according to claim 10, wherein said second n⁺ doped region and said fourth p⁺ doped region forming a source area of said extended gate layer are provided with separate contact pads.

* * * * *